United States Patent [19]

Miyata et al.

[11] Patent Number: 4,492,125

[45] Date of Patent: Jan. 8, 1985

[54] PUSH-BUTTON TUNER

[75] Inventors: Hiroyasu Miyata, Furukawa; Akio Yamaguchi; Keizo Watanabe, both of Iwaki, all of Japan

[73] Assignee: Sanshin Electric Co., Ltd., Kanagawa, Japan

[21] Appl. No.: 371,508

[22] Filed: Apr. 23, 1982

[30] Foreign Application Priority Data

Apr. 25, 1981 [JP] Japan .............................. 56-59215[U]

[51] Int. Cl.³ .......................... F16H 35/18; H03J 5/06
[52] U.S. Cl. ........................................ 74/10.33; 334/7
[58] Field of Search ............................ 74/10.33; 334/7

[56] References Cited

FOREIGN PATENT DOCUMENTS

| 2940576 | 4/1981 | Fed. Rep. of Germany | 74/10.33 |
| 82531 | 6/1980 | Japan | 74/10.33 |
| 2031673 | 4/1980 | United Kingdom | 74/10.33 |

*Primary Examiner*—Leslie A. Braun
*Assistant Examiner*—Michael J. Gonet
*Attorney, Agent, or Firm*—Guy W. Shoup; Gerard F. Dunne

[57] ABSTRACT

In a push-button tuner including a tuning slide member which has a positioning portion in one side edge and which is slidable in a predetermined direction, a lock member which is movable in a direction orthogonal to the sliding direction of the tuning slide member and which is provided with cam member grasping means, and a cam member which is turnably supported by the lock member. The cam member comes into engagement with the positioning portion of the tuning slide member and has its position in its turning direction fixed by the cam member grasping means. The positioning portion of the tuning slide member is provided with an elastic piece. When the lock member has been thrust to the tuning slide member, the cam member comes into pressed contact with the elastic piece, and the elastic piece retreats. Thus, the abutting force between the tuning slide member and the cam member is lightened.

6 Claims, 7 Drawing Figures

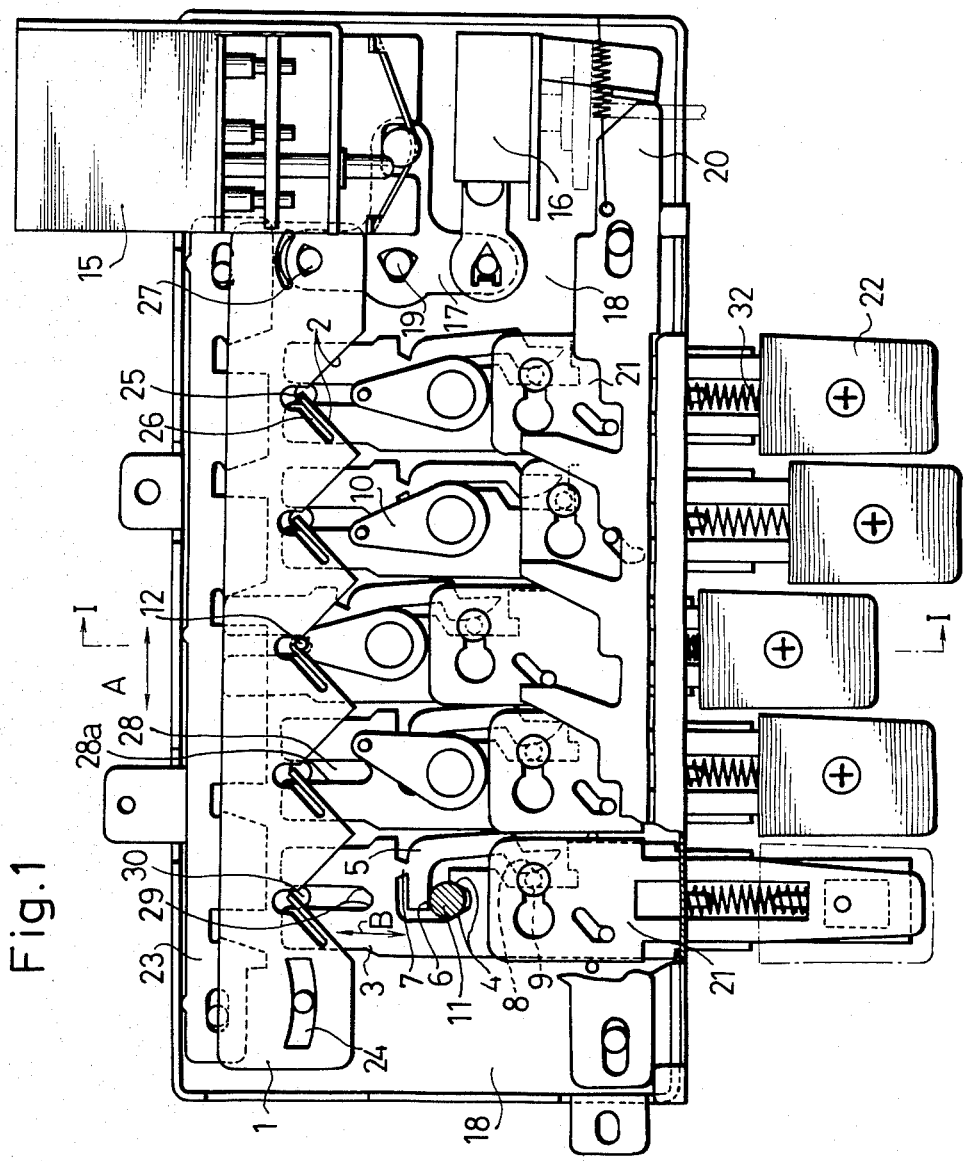

PUSH-BUTTON TUNER

BACKGROUND OF THE INVENTION

The present invention relates to a push-button tuner. More particularly, it relates to improvements in a push-button tuner including a slide member which slides in a predetermined direction to interlock with a tuning core, a lock member which is movable in a direction orthogonal to the sliding direction of the slide member and which is provided with means grasping a cam member turnably supported by the lock member for placing the tuning slide member in a preset position.

FIG. 6 is a partial plan view of a prior-art push-button tuner of the specified type.

Referring to FIG. 6, a slide plate 1 is movable in the directions indicated by the arrow A to adjust the position of a core within a tuning coil, as is well understood in the art. The slide plate 1 has a plurality, such as five, V-shaped grooves 2 formed along one side edge. Adjacent the V-shaped grooves 2, there is arranged a lock slide plate 3 which can move in the direction of the arrow B orthogonal to the sliding direction A of the tuning slide plate 1.

In a predetermined position of the lock slide plate 3, a V-shaped groove 4 opening rightward as viewed in the drawing is formed. Spaced rightwardly from the groove is the point of application 6 of a lever piece 5. The fore end part of the lever piece 5 is coupled with the lock slide plate 3 at a fulcrum point 7 for the lever piece 5. The free end side of the lever piece 5 acts as a point of force 8, and a lock pin 9 movable in the direction of the arrow B is inserted near the point of force.

A cam shaft 11 which is connected to the lower surface of a cam 10 is inserted between the V-shaped groove 4 of the lock slide plate 3 and the point of application 6 of the lever piece 5. An engaging protuberance 12 projects outwardly from the fore end part of the cam 10, and it is adapted to ride in contact with walls of the groove 2 of the tuning slide plate 1. During the advance or retreat of the lock slide plate 3 it is guided by guide members 13. Both ends of the tuning slide plate 1 are respectively supported by links 14, and the tuning slide plate 1 may slide in the direction of the arrow A by the turning of the links 14.

In a state before presetting, the lock pin 9 lies in a position shown by a dot-and-dash line, while the lever piece 5 lies at a position shown by a dot-and-dash line and its point of application 6 is away from the cam shaft 11. Accordingly, the cam shaft 11 is not grasped or held tightly between the groove 4 and the point of application 6, and the cam 10 is rotatable within the groove 4.

The tuner may then be tuned to a desired channel by manual operation, and the tuning slide plate will be moved in the direction A to the position corresponding to the selected channel. The locking slide plate 3 may then be slide toward the tuning slide plate 1 and, the engaging protuberance 12 of the cam 10 abuts against the inclined wall of the groove 2 in the tuning slide plate 1 at first. When the lock slide plate 3 is further advanced, the engaging protuberance 12 is guided by the inclined wall of the groove 2 and abuts against the bottom part thereof while the cam 10 is turning. Under this state, when the lock slide plate 3 is further pushed towards the tuning plate 1, the lock pin 9 is thrust against the side of the point of force 8 of the lever piece 5, and the lever piece 5 is urged towards the groove 4 about the fulcrum 7 as indicated by a solid line, and the cam shaft 11 is tightly held within the groove 4 and the point of application 6. Thus, the positioning of the cam 10 in the turning direction is made, and the presetting operation ends.

In selecting a preset station, the lock slide plate 3 with the cam 10 held in its preset position is pushed toward the tuning slide plate 1, while the tuning slide plate is freely slidable. Then, the engaging protuberance 12 of the cam 10 comes into contact with the inclined wall of the groove 2 of the tuning slide plate 1. By pushing the lock slide plate 3 still further, the slide plate moves in the direction A until the protuberance 12 moves into the bottom of the groove 2, so that the tuning slide plate 1 is positioned in its preset position. When the lock slide plate 3 is further pushed towards the slide plate 1, the engaging protuberance 12 of the cam 10 is intensely pushed against the bottom part of the groove 2, and it does not advance any more.

As described above, when the lock slide plate 3 is pushed inwardly in the direction of the arrow B during presetting of the tuner, and selecting the preset station, the cam 10 collides with the tuning slide plate 1, whereby the sliding of the lock slide plate 3 is stopped.

In the above device, both the ends of tuning slide plate 1 are respectively supported by the links 14, and the tuning slide plate 1 is not free to retreat in accordance with the thrust of the lock slide plate 3. Therefore, when the cam 10 collides against the tuning slide plate 1 by thrusting the lock slide plate 3, large forces act on the cam 10 and the tuning slide plate 1. This sometimes results in that the cam 10 is not properly locked at a desired position or that the cam 10 having been correctly locked with effort shifts due to the strong collision against the tuning slide plate 1. For such reasons, the preset condition of the tuner may vary and the tuner is thus not very reliable.

SUMMARY OF THE INVENTION

An object of the present invention is to eliminate such disadvantages of the prior art, and to provide a push-button tuner of high reliability free from improper tuning.

In order to accomplish the object, according to the present invention, a push-button tuner including a tuning slide member which has a positioning portion, for example, V-shaped grooves in one side edge, and which is slidable in is adapted to engage predetermined direction, a lock member movable in a direction orthogonal to the sliding direction of the tuning slide member. The lock member is provided with cam member grasping means in a predetermined place, and a cam member which is turnably supported by the lock member, comes into engagement with the positioning portion of the tuning slide member to fix its position by the cam member grasping means. An elastic piece which can be retreated by pressed contact of said cam member therewith when said lock member has been thrust to said tuning slide member is provided in said positioning portion of said tuning slide member, thereby to reduce an abutting force between said tuning slide member and said cam member.

BRIEF DESCRIPTION OF THE DRAWINGS

FIG. 1 is a plan view, partly broken away, of a push-button tuner according to an embodiment of the present invention.

FIG. 2 is a sectional view taken along line I—I in FIG. 1,

PREFERRED EMBODIMENTS OF THE INVENTION

Figure 3:
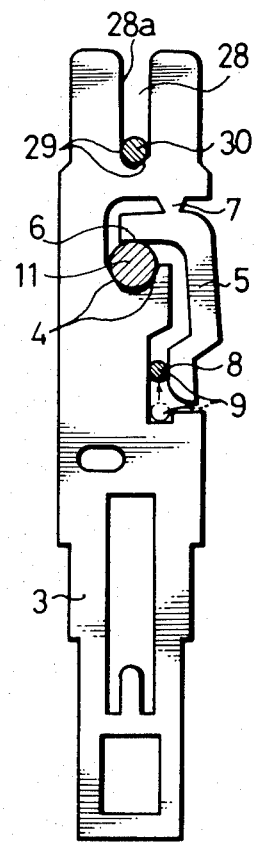
FIG. 3 is a plan view of a lock slide plate for use in the tuner.

Embodiments of the present invention will now be described with reference to FIGS. 1 to 5.

FIGS. 1 to 4b are views showing the first embodiment. In these figures, numeral 15 designates a tuning portion in which a tuning core is movably contained, numeral 16 indicates a manual operation portion which contains clutch means and which is connected with a knob portion, and numeral 17 indicates a T-shaped connecting member which serves to interlock a tuning slide plate 1, the tuning portion 15 and the manual operation portion 16 with one another and whose central part is turnably supported by a pivot pin 19 extending from a base plate 18. Numeral 20 indicates a release lever which is interlocked with the clutch means of the manual operation portion 16, numeral 21 indicates a plurality of arm slide plate which are each arranged on a lock slide plate 3 and slidable in the direction of arrow B, numeral 22 indicates a push button, and number 23 indicates a slide plate for the change-over between AM broadcasting and FM broadcasting.

Five V-shaped grooves 2 for positioning are continuously formed in one side edge of the tuning slide plate 1 and the lock side plate 3, and arm slide plate 21 are arranged to face the V-shaped grooves 2. As shown in FIG. 1, an arcuate slide groove 24 is formed at one end of the tuning slide plate 1, and a pin extends from the base plate 18 so as to slide within the slide groove 24. The other end of the tuning slide plate 1 is turnably supported by a supporting pin 27 of the T-shaped connecting member 17.

Figure 4A:
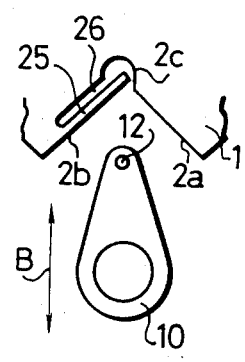
FIGS. 4a and 4b are plan views of essential portions for explaining the operative state of an elastic piece.
Figure 4B:
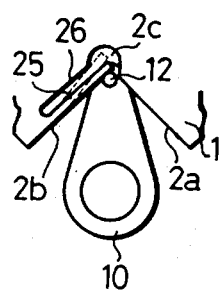

As shown in FIGS. 4a and 4b, each V-shaped groove 2 of the tuning slide plate 1 has two slanting faces 2a and 2b. Near the forward part of one slanting face 2a, a straight face 2c is continuously provided in the moving direction B of the lock slide plate 3. The other slanting face 2b is provided by a side surface of an elastic piece 25 which is formed in an oblique direction unitarily with the tuning slide plate 1. The free end of the elastic piece 25 extends near the straight face 2c, and a gap 26 for allowing elastic deformation of the elastic piece 25 is formed between the elastic piece 25 and the tuning slide plate 1.

Each lock slide plate 3 is made of a spring steel plate, and is provided in a predetermined position with a cam shaft bearing portion 4 which is formed of a V-shaped groove opening in the advancing direction of the slide plate 1. A lever piece 5 which is substantially L-shaped in plan is coupled unitarily with the lock slide plate 3 at a supporting point 7, and a point of application 6 exists at the position of the lever piece 5 opposing the cam shaft bearing portion 4. Accordingly, the cam shaft 11 is held between the point of application 16 and the bearing portion 4 so that the application of the gripping force to the cam shaft 11 is substantially parallel to the moving direction B of the lock slide plate 3 and is substantially orthogonal to the sliding direction A of the tuning slide plate 1. The cam shaft 11 is turnably inserted and supported between the cam shaft bearing portion 4 and the point of application 6, and a cam 10 having an engaging protuberance 12 is connected onto the cam shaft 11.

The fore end part of the lock slide plate 3 is formed with a guide groove 28 extending in the moving direction B of the plate 3. The left side end face 28a of the guide groove 28 is machined at a high surface precision, and serves as a reference surface. A stopper abuttal portion 29 is provided in the inner surface of the guide groove 28. In this embodiment, the stopper abuttal portion 29 may be formed by a substantially V-formed groove with the inner end of the left side end face 28a being the reference surface and a slant surface provided at the inner end of the right side end face of the groove 28. A stopper 30 which is circular in plan is extended on the base plate 18, and is inserted in the guide groove 28. The stopper 30 is even with or somewhat lower than the upper surface of the lock slide plate 3 so as not to hamper the sliding of the tuning slide plate 1.

The bottom part of the V-shaped groove 2 in the tuning slide plate, i.e., 1 the part between the boundary of the slant face 2a and the straight advance face 2c and the free end of the elastic piece 25, the engaging protuberance 12 of the cam 10, the stopper abuttal portion 29, and the stopper 30 lie in a positional relationship as stated below. At the time when the lock slide plate 3 has been thrust toward the tuning slide plate 1 until the abutment of the engaging protrusion 12 upon the bottom part of the V-shaped groove 2 as illustrated by a solid line in FIG. 4b, the stopper abuttal portion 29 does not abut upon the stopper 30 yet. By thrusting the lock slide plate 3 still more, the elastic piece 25 bends onto the side of the gap 26 as illustrated by a dotted line in FIG. 4b, and the engaging protrusion 12 is thrust between the straight advance face 2c and the free end of the retreated elastic piece 25. Here, the abuttal portion 29 abuts upon the stopper 30, and the thrust of the lock slide plate 3 stops.

The second push button 22 from the right side as viewed in FIG. 1 is pulled outwardly the most. Under this state, the stopper pin 9 is away from the lever piece 5, and the cam 10 is not locked and is turnable. When the push button 22 is depressed inwardly, the lock slide plate 3 and the arm slide plate 21 move together, and the engaging protuberance 12 abuts upon either of the slant faces 2a and 2b of the V-shaped groove 2. Upon further depressing the push button 22, the engaging protuberance 12 reaches the bottom part of the V-shaped groove 2 by the guide of the slanting faces 2a and 2b while turning with the cam 10. Then, the positioning of the cam 10 in the turning direction is made.

When the push button 22 if further depressed, the elastic piece 25 is bent and retreats by the pressed contact of the engaging protuberance 12. This time, the stopper abuttal portion 29 of the lock slide plate 3 abuts upon the stopper 30. When the push button 22 is intensely depressed in this state, the lock pin 9 is thrust onto the side of the point of force 8 of the lever piece 5. Thus, the lever piece 5 bends about the fulcrum 7, and the cam shaft 11 is locked between the cam shaft bearing portion 4 and the point of application 6. Then, the presetting operation ends.

When pressure is thereafter released from the push button 22, the assembly consisting of the lock slide plate 3, cam 10, arm slide plate 21 and push button 22 is returned to the original normal position by the restoring force of a return spring 32 having been previously compressed.

Next, in selecting the preset station, the cam-locked lock slide plate 3 is pushed inwardly. Then, the engaging protuberance 12 comes into contact with either the slant face 2a or 2b of the V-shaped groove 2 of the tuning slide plate 1 being now slidable. By pushing the lock slide plate 3 still more, the tuning slide plate 1 slides with the turning of the T-shaped connecting member 17, and the engaging protuberance 12 reaches the bottom part of the V-shaped groove 2. Then, the positioning of the tuning slide plate 1 is made. Upon further pushing the lock slide plate 3, the elastic piece 25 bends rearward, and the stopper abuttal portion 29 abuts upon the stopper 30. Here, the movement of the lock slide plate 3 stops. Also in this case, upon releasing the pressure from the push button 22, the assembly consisting of the lock slide plate 3, cam 10, arm slide plate 21 and push button 22 is returned to the original position by the restoring force of the return spring 32.

Figure 5:
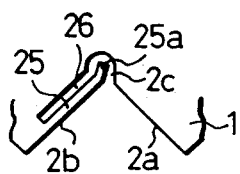
FIG. 5 is a plan view of essential portions showing a modification of the elastic piece.
Figure 6:
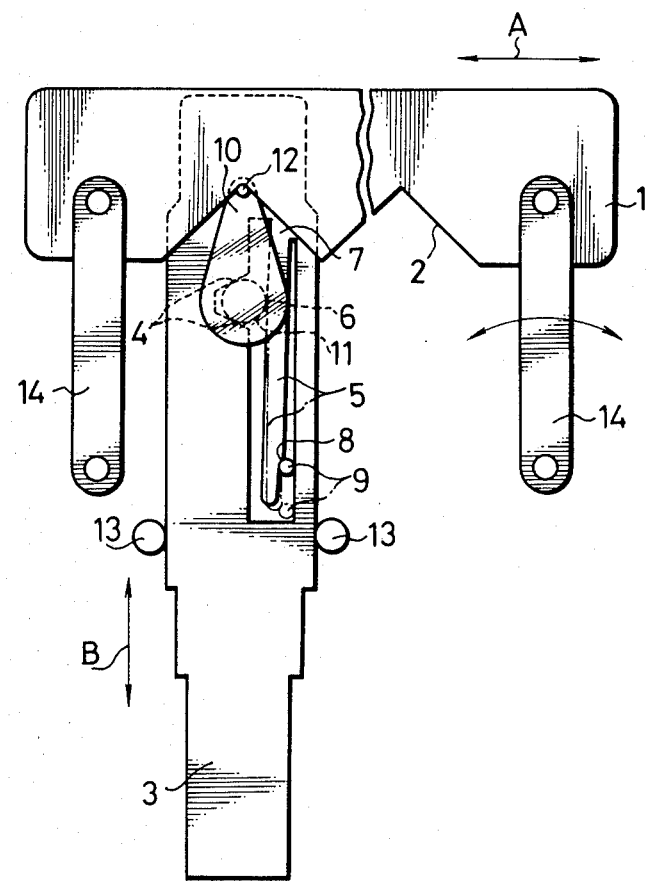
FIG. 6 is a partial plan view of a prior-art push-button tuner.

FIG. 5 is a partial plan view showing a modified embodiment of the elastic piece 25. In this case, the free end 25a of the elastic piece 25 curves rearward and opposes the straight advance face 2c. Since the other construction, the operating principle, etc. are the same as in the preceding embodiment, they will not be explained.

In the foregoing embodiments, the stopper abuttal portion 29 is disposed on the lock slide plate 3, and the stopper 30 on the base plate 18. It is also allowed, however, to dispose the stopper 30 on the lock slide plate 3 and the stopper abuttal portion 29 on the base plate 18.

As set forth above, according to the present invention, when the lock member has been thrust into the tuning slide member, the elastic piece unitarily formed in the positioning portion of the tuning slide member bends rearwardly. Therefore, even when the lock member has been intensely thrust, the tuning slide member is not thereby moved, but the thrust is absorbed by the bending of the elastic piece, so that any excess force does not act on the cam member and the tuning slide member. Accordingly, the cam member and the tuning slide member are properly positioned without any positional deviation, and a push-button tuner of high reliability can be provided.

When, as explained on the previous embodiment, the stopper means for controlling the stroke of the lock member is jointly disposed between the lock member and the base plate for supporting it and the movement of the lock member is stopped by the stopper means in the course of the retreat of the tuning slide member, the abutting force between the cam member and the tuning slide member is further reduced.

We claim:

1. A push-button tuner having an elongate slide ember adapted to be moved longitudinally for tuning the tuner, said slide member having means formed by inclined portions of a side edge thereof for sliding said member longitudinally upon receiving a thrust force perpendicular to the longitudinal direction of movement of said slide member, means including a lock member movable in the direction perpendicular to said longitudinal direction of movement and carrying a cam adapted to engage said inclined portions for sliding said slide member longitudinally upon applying a thrust force to said inclined portions form said cam, said inclined portions being formed at least in part by means including an elastic element secured at one end portion of said side edge for deflecting inwardly under a thrust load applied by said cam.

2. A push-button tuner according to claim 1, said inclined portions forming a V-shaped notch with one side wall thereof being formed by said elastic element, said notch having a recessed portion formed in its inner portion for receiving the free end of said elastic member.

3. A push-button tuner according to claim 2, further including means anchored in position in said tuner and adapted to engage cooperative structures carried by said lock member for limiting inner movement of said lock member.

4. A push-button tuner according to claim 3, said means anchored in said tuner including a pin and said cooperative structures including a slot formed in said lock member and receiving said pin.

5. A push-button tuner according to claim 1, further including means anchored in position in said tuner and adapted to engage cooperative structures carried by said lock member for limiting the inner movement of said lock member.

6. A push-button tuner according to claim 5, said means anchored in said tuner including a pin and said cooperative structures including a slot formed in said lock member and receiving said pin.

* * * * *